United States Patent
Rohrbaugh et al.

(10) Patent No.: US 6,707,313 B1
(45) Date of Patent: Mar. 16, 2004

(54) SYSTEMS AND METHODS FOR TESTING INTEGRATED CIRCUITS

(75) Inventors: John G Rohrbaugh, Ft Collins, CO (US); Jeff Rearick, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/369,069

(22) Filed: Feb. 19, 2003

(51) Int. Cl.[7] .............................................. G01R 31/26
(52) U.S. Cl. ...................................................... 324/765
(58) Field of Search ................................ 324/765, 751, 324/72.5, 158.1, 73.1; 714/738, 726, 727, 720, 742

(56) References Cited

U.S. PATENT DOCUMENTS 5,521,516 A  *  5/1996  Hanagama et al. ......... 324/751
6,067,651 A  *  5/2000  Rohrbaugh et al. ......... 714/738

\* cited by examiner

Primary Examiner—Kamand Cuneo
Assistant Examiner—Trung Q. Nguyen

(57) ABSTRACT

Systems and methods for testing integrated circuits are provided. One such method comprises: providing a target fault list corresponding to an integrated circuit, the target fault list including at least a first fault and a second fault; measuring a relationship between the first fault and the second fault, the relationship corresponding to which of the first fault and the second fault is more readily detected by automatic test pattern generation; ordering the first fault and the second fault within the target fault list in a manner corresponding to the relationship; and performing automatic test pattern generation based upon an order of the faults of the target fault list. Systems and other methods also are provided.

20 Claims, 4 Drawing Sheets

| FAULT NAME | FAULT COUNT | TEST PATTERN IDENTIFIER |
|---|---|---|
| A s-a-0 | 2 | 5 |
| | | |
| | | |
| | | |

FIG. 4

SYSTEMS AND METHODS FOR TESTING INTEGRATED CIRCUITS

BACKGROUND

Efficient testing of integrated circuits (ICs) has become increasingly difficult due to increased density of the ICs. Attributes of increased IC density include an increased distribution of logic located within a single IC to enable performance of an increased number of functions via use of the IC.

A goal of IC testing is to verify that each IC has been manufactured without defects. At a high level, IC testing may be viewed as coupling the IC to a host system and determining whether the host system appears to be functioning normally while running an application that utilizes the IC. If the host system functions normally, then a determination is made that the IC is ready to be shipped. However, this type of system-level test does not ensure that the IC is defect-free since the given applications used to test the IC may merely exercise a subset of functionality made available by the IC.

Thorough testing of ICs requires the application of test patterns with very high fault coverage. As is known, faults are logical abstractions of physical defects that result in errors received during testing of an IC, or during use of the IC. Examples of faults include, but are by no means limited to, stuck-at, transition, path delay, and bridging faults. Fault coverage of a set of test patterns is a measure of a percentage of possible faults that are detected by the test patterns. For a large and complex IC (i.e., a high density IC), the task of creating a set of patterns that provide full fault coverage can be very difficult and time consuming. Specifically, the sequential depth of circuitry embedded within the IC, in addition to a very large logic-to-pin ratio, results in pin-based functional testing being prohibitive due to time requirements associated with testing and demands on test resources.

Due to the above difficulties, most ICs are tested using structured design-for-testability (DFT) techniques. DFT techniques utilize the general concept of selecting a portion or all digital circuit elements within an IC, such as flip-flops and logic gates, that are directly controllable and observable within the IC. An example of a commonly used DFT technique is scan design, in which flip-flops are serially linked together in scan chains. During testing, data is shifted serially into the flip-flops located along the scan path while the IC is in a test mode. The flip-flops are then clocked one or more times while the IC is in a normal mode, thereby capturing the resulting response of the logic gates located within the IC to the final scanned-in state stimulus. The captured data is serially shifted out of the IC while in the test mode. Data captured during IC scan testing is analyzed by test equipment located external to the IC as the data is shifted out of the IC, thereby determining whether a correct response was obtained for each IC test stimulus. This style of testing is known as "structural testing," as opposed to "functional testing," which is performed through pins of the IC while the IC is in normal mode.

To create a structural test for an IC, a software tool referred to as an automatic test pattern generator (ATPG) utilizes a simulation model of the IC that includes the scan flip-flops and combinational logic of the IC, as well as a target fault model that represents a specific class of defects. When applied to the simulation model of a given IC, the target fault model results in a list of specific faults, also referred to as a target fault list, for which test patterns are to be generated. A deterministic ATPG superimposes each fault within the target fault list on the simulation model of the IC in order to guide the creation of a specific test pattern, also referred to as a test vector, that is intended to expose the superimposed fault. The ATPG generates test patterns for each location in the IC model at which a fault, and thereby an associated defect, could exist. Each test pattern is a set of 1s and 0s that are necessary to excite and propagate the hypothesized fault to an observation point (i.e., a scannable flip-flop), as well as the expected response of a defect-free IC. If an IC responds to a test pattern with data other than that expected, then the hypothesized fault is deduced to be present and the IC is considered to be defective.

Typically, a complete set of test patterns is intended to cover all possible faults in an IC, thereby achieving full fault coverage. For high density ICs, the number of faults that require consideration during ATPG can be quite substantial. As such, attempts at ATPG can create large numbers of test patterns, each of which typically detects only a small number of faults. Such inefficiencies could delay the completion of an IC chip design project and/or slow time-to-market of an IC. Furthermore, such inefficient testing can require high tester memory and longer test application time, thereby increasing cost of the IC.

SUMMARY

Systems and methods for testing integrated circuits are provided. An embodiment of a method comprises: providing a target fault list corresponding to an integrated circuit, the target fault list including at least a first fault and a second fault; measuring a relationship between the first fault and the second fault, the relationship corresponding to which of the first fault and the second fault is more readily detected by automatic test pattern generation; ordering the first fault and the second fault within the target fault list in a manner corresponding to the relationship; and performing automatic test pattern generation based upon an order of the faults of the target fault test.

An embodiment of a system comprises: a memory operative to store information corresponding to a target fault list of an integrated circuit, the target fault list including at least a first fault and a second fault; and a processor communicating with said memory, the processor being operative to measure a relationship between the first fault and the second fault, the relationship corresponding to which of the first fault and the second fault is more readily detected by automatic test pattern generation, to order the first fault and the second fault within the target fault list in a manner corresponding to the relationship, and to perform automatic test pattern generation based upon an order of the faults of the target fault test.

Computer-readable media also are provided that include computer programs for providing integrated circuit test pattern generation. An embodiment of a computer-readable medium comprises: logic configured to provide a target fault list corresponding to an integrated circuit, the target fault list including at least a first fault and a second fault; logic configured to measure a relationship between the first fault and the second fault, the relationship corresponding to which of the first fault and the second fault is more readily detected by automatic test pattern generation; logic configured to order the first fault and the second fault within the target fault list in a manner corresponding to the relationship; and logic configured to perform automatic test pattern generation based upon an order of the faults of the target fault test.

Other systems, methods, feature and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components of the drawings are not necessarily to scale. Moreover, in the drawings, like referenced numerals designate corresponding parts throughout the several views.

FIG. 4 is a schematic diagram of a fault dictionary that can be used to store information associated with the system of FIG. 3.

DETAILED DESCRIPTION

Figure 1:
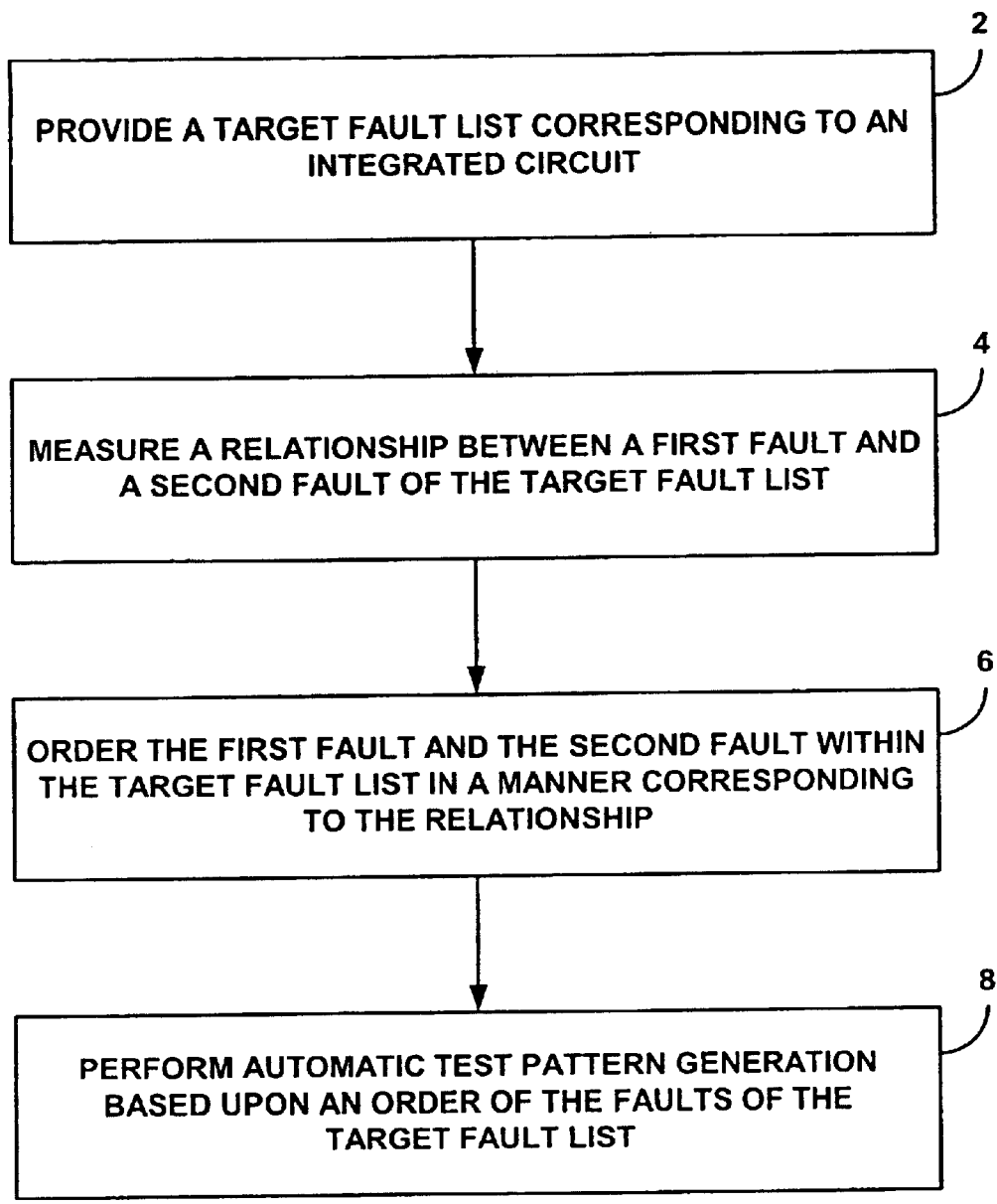
FIG. 1 is a flowchart illustrating functionality of an embodiment of a system for testing integrated circuits.

As will be described in detail here, systems and methods are provided that can increase the efficiency of integrated circuit (IC) testing. In some embodiments, this is accomplished by providing a target fault list that can be modified in response to a measured determination of which of the faults of the target fault list are more readily detected and/or are more resistant to detection by automatic test pattern generation. Based upon the measured determination, the faults of the target fault list can be reordered and then automatic test pattern generation can be used to detect the faults of the target fault list. This potentially enables faults of an IC to be detected in a reduced amount of processing time than may otherwise be achieved using automatic test pattern generation.

When an ATPG operates on a model of an IC to generate a pattern set, it typically begins by generating a deterministic pattern which detects a targeted fault from a target fault list. For a typical IC, this pattern will use only a very small number of the inputs of the IC, i.e., pins and scan registers. As an aside, if an ATPG compaction mode is enabled, then the ATPG will attempt to detect additional faults by adding to, i.e., using more inputs of the IC, an existing deterministic pattern. However, even with compaction enabled, a typical deterministic pattern will still use only a very small number of the inputs of the IC.

Once a deterministic pattern has been generated, there are other factors to consider. In addition to detecting the targeted fault(s), a pattern may also detect additional untargeted faults (the ATPG can check this by fault-simulating the pattern against the IC model). Other things being equal, the number of faults that will be detected by a pattern has a strong correlation to the number of inputs used by the pattern. These factors are true not only for deterministic patterns, but also for non-deterministic, e.g., pseudo-random, patterns. Thus, it is typical for an ATPG to pseudo-randomly fill (assign values to unused inputs) a deterministic pattern so that it has the potential to detect additional faults.

Non-deterministic patterns have three characteristics of note: 1) they can be generated with relatively little computational effort, 2) a single non-deterministic pattern typically detects a large number of faults, and 3) the total number of unique faults detected by a set of non-deterministic patterns tends to grow at an increasingly slower rate as additional non-deterministic patterns are added to the pattern set. In other words, the first several non-deterministic patterns in a pattern set typically are very effective, but the effectiveness of adding subsequent non-deterministic patterns to the pattern set becomes typically less and less until it is negligible.

Meanwhile, although generating deterministic patterns tends to require significant computation, it is typically effective to add a deterministic pattern to a pattern set since the deterministic pattern is guaranteed to detect at least one new fault.

When a deterministic pattern is pseudo-randomly filled, it becomes "mostly" non-deterministic (because most of the inputs of the IC are filled with pseudo-random data). Thus, the filled deterministic pattern tends to have the characteristics of a non-deterministic pattern, but it also retains the advantage of detecting at least one unique fault. The implication of these deterministic and non-deterministic characteristics is that a larger number of faults typically can be easily detected by non-deterministic patterns, while a smaller number of faults are not. Thus, the desire is for the ATPG to focus on detecting faults which are random-pattern resistant, i.e., relatively difficult to detect with non-deterministic patterns. This means that it is advantageous to order the target fault list such that the random pattern resistant faults are considered first.

Once the faults of a target fault list are ordered, one or more test patterns can be applied for the detection of a fault that is more highly resistant to detection by pseudo-random patterns applied by an ATPG prior to applying test patterns for the detection of faults that are less resistant to detection by pseudo-random patterns. Each test pattern used to detect a fault may include a deterministic pattern, which is configured to detect one or more designated faults, and can further include random data which is applied to the inputs of the IC that are not used by the deterministic pattern. If a particular test pattern is successful in detecting a targeted fault, the targeted fault can be removed from the target fault list along with any additional faults that are detected by the random data. Once detected, additional test patterns need not be applied to the IC for detecting these faults.

Referring now to the drawings, FIG. 1 is a flowchart depicting functionality of a representative embodiment of a system for testing an IC. As shown in FIG. 1, the functionality (or method) may be construed as beginning at block 2, where a target fault list corresponding to an IC is provided. In block 4, measurements are taken to determine relationships between at least some of the faults of the target fault list. For example, a determination may be made as to which fault of the target fault list is more resistant to detection by automatic test pattern generation. In block 6, at least some of the faults can be ordered within the target fault list in a manner that corresponds to the determined relationship(s). In block 8, automatic test pattern generation is performed based upon an order of the faults of the target fault list. In some embodiments, automatic test pattern generation can include generating a complete set of test patterns that detect as many faults as possible.

Note, with respect to the flowchart of FIG. 1, or in any other of the accompanying flowcharts, the functions noted in the blocks may occur out of the order depicted. For example, two blocks shown in succession may in fact be executed substantially concurrently. In other embodiments, the blocks may sometimes be executed in the reverse order, depending upon the functionality involved.

Figure 2:
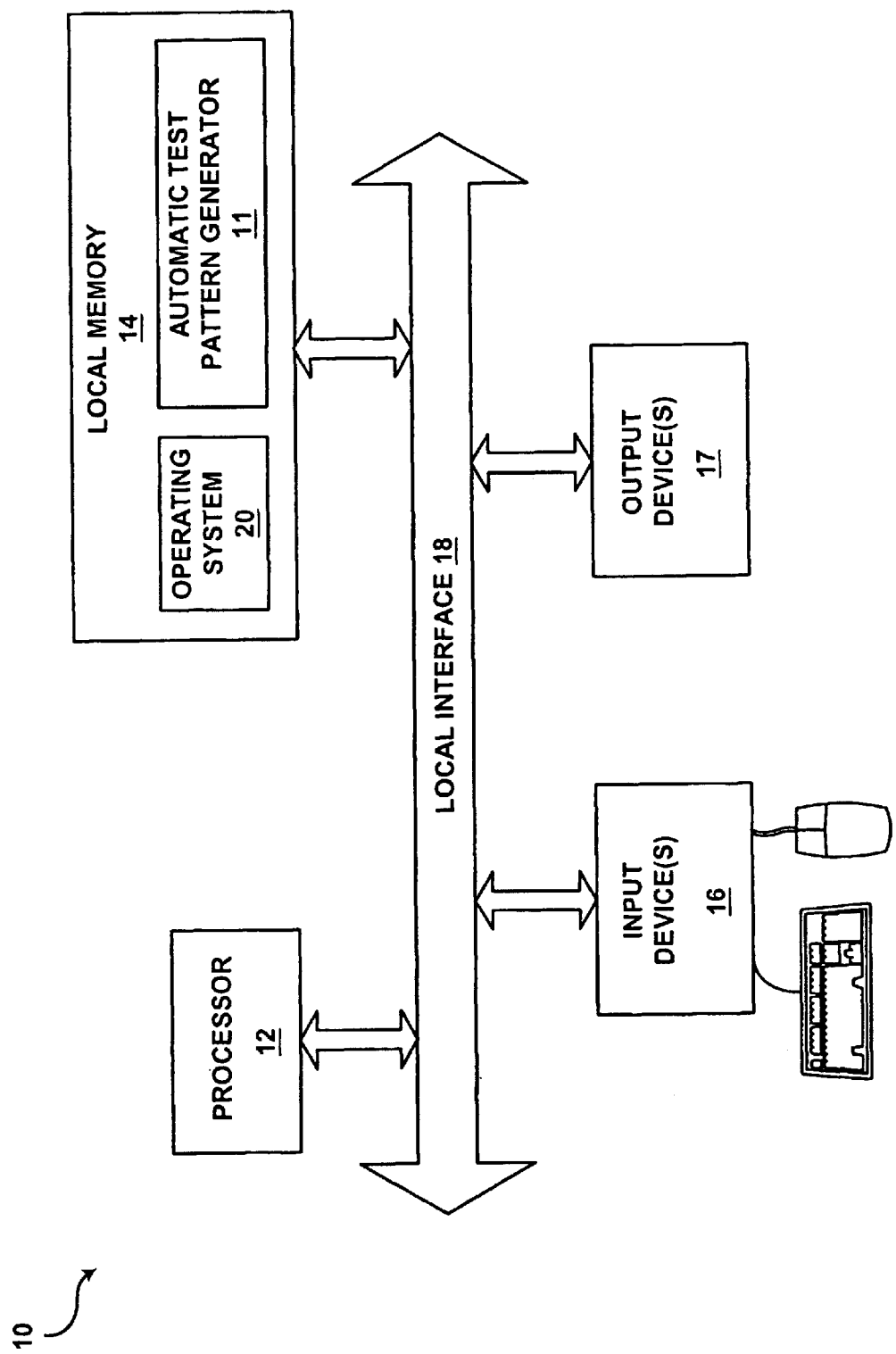
FIG. 2 is a schematic diagram of an embodiment of an automatic test pattern generator (ATPG).

FIG. 2 is a schematic diagram of a test system 10 that includes an embodiment of an ATPG 11 which generates test patterns for testing ICs in a manner corresponding to the functionality of FIG. 1. In particular, test system 10 involves the use of test patterns that are generated and applied to targeted faults in a manner corresponding to the resistance of the faults to detection by automatic test pattern generation. In this regard, the ATPG 11 also enables a ranked target fault list to be created. The structure and functionality performed by the test system 10 of FIG. 2 is described in detail below.

It should be noted that the test system 10 of FIG. 2 is implemented as a computer that includes an ATPG 11 stored in local memory. The term "computer" refers to a device(s) having a memory and a processor. In addition, while the embodiment of the test system 10 of FIG. 2 is implemented as a computer, the test system 10 may instead be provided as an algorithmic-processing device, whether encompassing a general purpose computer or a dedicated machine. Further, the test system 10 may instead be provided partially or entirely via hardware, wherein logical devices such as, but not limited to, flip-flops, are utilized to perform functions that are described in detail below.

Generally, in terms of hardware architecture, the test system 10 includes a processor 12, local memory 14, one or more input devices 16 and one or more output devices 17, each of which are communicatively coupled via a local interface 18. The local interface 18 can be, for example, one or more buses or other wired or wireless connections. The local interface 18 may have additional elements, which are omitted for simplicity, such as controllers, buffers (caches), drivers, repeaters, and receivers, to enable communication within the test system 10. Further, the local interface 18 may include address, control, and/or data connections to enable appropriate communications among the aforementioned elements of the test system 10.

The processor 12 is a hardware device for executing software, particularly software that is stored within the local memory 14 The local memory 14 can include any one or combination of volatile memory elements (eg., random access memory (RAM), such as dynamic RAM (DRAM), static RAM (SRAM), Flash RAM, magnetic RAM (MRAM), etc.)) and/or nonvolatile memory elements (e.g., read-only memory (ROM), hard drive, tape and compact disc read-only-memory (CDROM), etc.). Moreover, the local memory 14 may incorporate electronic, magnetic, optical, and/or other types of storage media. Note that the local memory 14 can have a distributed architecture, where various components are situated remote from one another, but can be accessed by the processor 12.

The ATPG 11 located within the local memory 14 may include one or more separate programs, each of which comprises an ordered listing of executable instructions for implementing logical functions required by the test system 10. The local memory 14 may also include an operating system (O/S) 20. The O/S 20 controls execution of other computer programs that may be located within the test system 10, and provides scheduling, input-output control, file and data management, memory management, communication control and related services.

The input devices 16 may include, for example, a keyboard, mouse, scanner, microphone, etc. Furthermore, the output devices 17 may include, for example, a printer, display, etc. Alternatively, the input devices 16 and output devices 17 may be replaced by devices that are capable of communicating as both inputs and outputs, for instance but not limited to, an IC interface, a modulator/demodulator (modem for accessing another device, system, or network), a radio frequency (RF) or other transceiver, a telephonic interface, a bridge, a router, etc.

When the test system 10 is in operation, the processor 12 is configured to execute the ATPG 11, and any other software stored within the local memory 14, to communicate data to and from the local memory 14, and to generally control operations of the test system 10 pursuant to the ATPG 11 stored within the local memory 14.

Specifically, ATPG 11 generates test patterns, such as pseudo-random test patterns, that are to be used by the test system 10. Although not depicted in FIG. 2, ATPG 11 can include, or is otherwise configured to access, a netlist and a fault dictionary. It should be noted that the netlist and fault dictionary may be forms of abstract data structures used to represent a set of elements for the internal connectivity of an IC and fault information for the IC, respectively. An example of a data structure may include, but is not limited to, a table of cells for storing data. An example of a netlist is a Verilog® netlist, the characteristics of which are known to those of ordinary skill in the art. Such a netlist is used by the test system 10 during identification of faults in an IC and during derivation of test patterns for the IC. The embodiment of the ATPG 11 of FIG. 2 also provides fault simulation capabilities to the test system 10.

Note, when ATPG is implemented in software, the ATPG can be stored on a computer-readable medium for use by or in connection with a computer-related system or method. In the context of this document, a computer-readable medium is an electronic, magnetic, optical, or other physical device or means that can contain or store a computer program for use by or in connection with a computer-related system or method.

A computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In general, embodiments of test systems, e.g., test system 10 of FIG. 2, are programmed in accordance with knowledge that some faults of an IC are more difficult to detect using automatic test pattern generation than others. Typically, test patterns for testing hard-to-test faults often excite and propagate easy-to-test faults. Therefore, in attempting to detect hard-to-test faults, easy-to-test faults can, and oftentimes will, be detected. Functionality of an embodiment of a test system that ranks faults based on their relative resistance to detection by automatic test patterns generation will now be described with reference to the flowchart of FIG. 3.

Figure 3:
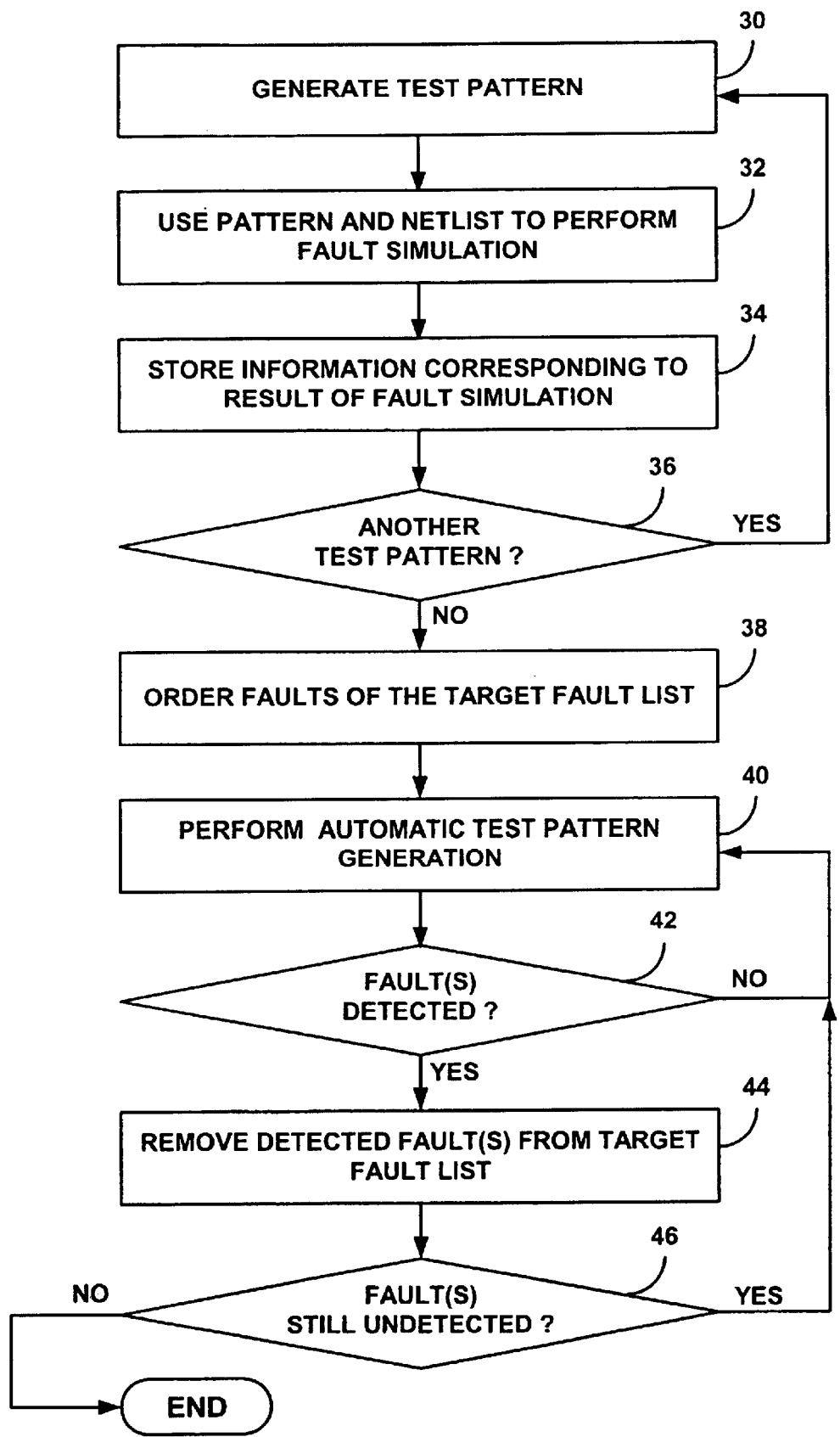
FIG. 3 is a flowchart illustrating functions performed by an embodiment of a system for testing ICs.

As shown in FIG. 3, the functionality (or method) may be construed as beginning at block 30, where a test pattern, e.g., a random test pattern, is generated. In block 32, the test pattern and an associated netlist, which contains information corresponding to the IC that is to be tested, are used to perform fault simulation. In block 34, information obtained by the fault simulation is stored. Specifically, information that relates to a correlation between the test pattern and the faults of a target fault list is stored, such as in a fault dictionary. This can include information corresponding to the faults detected by a particular test pattern. Then, in block 36, a determination is made as to whether another test pattern is to be generated. If another test pattern is to be generated, the process may return to block 30 and proceed as described before. Note that when multiple test patterns are generated and fault simulation of the test patterns is conducted, information can be stored that includes the number of times that a fault has been detected during fault simulation.

If it is determined in block 36 that another test pattern is not to be generated and/or fault simulated, the process proceeds to block 38. In block 38, the faults of the target fault list are ordered based upon the results obtained during fault simulation. Specifically, the faults are ordered based upon their relative resistance to detection by automatic test pattern generation. Thus, in some embodiments, the faults that are more resistant to detection are placed before those faults of the target fault list that are less resistant to detection by automatic test pattern generation. In such an embodiment, the faults that are more resistant to detection are subjected to testing by automatic test pattern generation prior to the faults that are less resistant to detection.

In block 40, automatic test pattern generation is performed based upon the order of the faults in the target fault list. Note, random data may be applied to the unused inputs of the IC under test during application of a test pattern. This may enable additional faults to be detected. In block 42, a determination is made as to whether one or more of the faults of the target fault list have been detected, i.e., detected by the generated test pattern during fault simulation. If no faults have been detected, the process may return to block 40, where an additional test pattern is applied. However, if one or more faults are detected in block 42, the process may proceed to block 44. Specifically, in block 44, any fault that is detected can be removed from the target fault list. This potentially improves the efficiency of automatic test pattern generation, in that additional test patterns need not be generated for detecting faults that have been previously detected. In block 46, a determination then is made as to whether there are any additional faults on the target fault list that remain to be detected. If any faults remain on the target fault list, the process may return to block 40, and proceed as described before. However, if all of the faults of the target fault list have previously been detected by a test pattern, the process may end. Note, the process also can be discontinued if an adequate number of test patterns have been applied and/or an adequate number of faults have been detected, for example.

FIG. 4 is a schematic diagram illustrating an embodiment of a fault dictionary 52 that can be associated with a test system. As shown in FIG. 4, the fault dictionary 52 contains a series of four rows, specifically, a first row 62, a second row 64, a third row 66, and a fourth row 68. The fault dictionary 52 also contains a series of columns, specifically fault name column 54, fault count column 56, and test pattern identifier column 58. A cell is located at each intersection of a row and a column. In other embodiments, additional or fewer columns and/or rows may be provided within a fault dictionary.

Each cell within the fault name column 54 stores a name or representation of a fault. Examples of fault names include, but are not limited to, "stuck-at," "transition," "path delay," and "bridging." It should be noted that the label "A s-a-0" is a representation of the fault name "stuck at," having the meaning, circuit node "A" stuck at a logic level of 0. Alternatively, each cell within the fault column 54 may store a name of a fault that has been detected during fault simulation.

Each cell within the fault count column 56 stores a count of a number of times a fault has been detected during fault simulation, and each cell within the test pattern identifier column 58 stores a numerical identifier that represents at least one test pattern, e.g., a pseudo-random test pattern. In a row of the fault dictionary 52, the numerical identifier identifies the test pattern that was used to detect the corresponding fault with the name of the fault being stored in the fault name column 54. As an example, the first row 62 of the fault dictionary 52 is associated with a fault count of two (2) and a test pattern identifier of rive (5). The numerical identifier typically is the seed number utilized to obtain the test pattern.

Values stored within the cells of the fault count column 56 and the test pattern identifier column 58 are preferably set to null prior to initiation of a test system, such as test system 10 of FIG. 2. After fault simulation, the faults can be ordered in the target fault list in a manner corresponding to the respective fault counts. In some embodiments, the fault dictionary can function as the target fault list.

It should be emphasized that the above-described embodiments are merely possible examples of implementations set forth for a clear understanding of the principles of the invention. Many variations and modifications may be made to the above-described exemplary embodiments without departing substantially from the spirit and principles of the invention. All such modifications and variations are intended to be included herein within the scope of this disclosure and protected by the following claims.

What is claimed is:

1. A method for testing an integrated circuit comprising:

providing a target fault list corresponding to an integrated circuit, the target fault list including at least a first fault and a second fault;

measuring a relationship between the first fault and the second fault, the relationship corresponding to which of the first fault and the second fault is more readily detected by automatic test pattern generation;

ordering the first fault and the second fault within the target fault list in a manner corresponding to the relationship; and performing automatic test pattern generation based upon an order of the faults of the target fault list.

2. The method of claim 1, wherein, in ordering the first fault and the second fault, the target fault list is modified so that the first fault is considered during automatic test pattern generation before the second fault if the first fault is more resistant to detection by pseudo-random patterns than the second fault.

3. The method of claim 1, wherein, in ordering the first fault and the second fault, the target fault list is modified so that the first fault is considered during automatic test pattern generation before the second fault if the first fault is detected a fewer number of times than the second fault is detected.

4. The method of claim 1, wherein measuring comprises:

fault simulating at least one test pattern on a netlist of the integrated circuit.

5. The method of claim 4, wherein the at least one test pattern is a pseudo-random test pattern.

6. The method of claim 4, further comprising:

counting a number of times each fault has been detected by a test pattern such that each fault has a corresponding count; and storing information corresponding to the count of each fault.

7. The method of claim 4, further comprising:

storing information corresponding to each test pattern that has detected a fault.

8. The method of claim 4, wherein, in performing automatic test pattern generation, at least one test pattern is used that also was used during the fault simulating step.

9. The method of claim 1, wherein measuring comprises measuring which of the faults is more resistant to detection by automatic test pattern generation.

10. The method of claim 1, wherein measuring comprises measuring which of the faults is more readily detected by automatic test pattern generation.

11. The method of claim 1, further comprising:

storing information associated with at least one fault, the information being determined during the measuring step.

12. The method of claim 11, wherein storing information comprises storing information in a fault dictionary.

13. A system for testing an integrated circuit, comprising:

a memory operative to store information corresponding to a target fault list of an integrated circuit, the target fault list including at least a first fault and a second fault; and a processor communicating with said memory, said processor being operative to measure a relationship between the first fault and the second fault, the relationship corresponding to which of the first fault and the second fault is more readily detected by automatic test pattern generation, to order the first fault and the second fault within the target fault list in a manner corresponding to the relationship, and to perform automatic test pattern generation based upon an order of the faults of the target fault list.

14. The system of claim 13, further comprising:

a fault simulator communicating with said processor, said fault simulator being operative to fault simulate at least one test pattern on a netlist of the integrated circuit such that the relationship between the first fault and the second fault can be measured.

15. The system of claim 13, further comprising:

an integrated circuit communicating with said processor.

16. The system of claim 13, further comprising:

a fault dictionary stored in said memory, said fault dictionary comprising information corresponding to the relationship between the first fault and the second fault.

17. A system for testing an integrated circuit, comprising:

means for providing a target fault list corresponding to an integrated circuit, the target fault list including at least a first fault and a second fault;

means for measuring a relationship between the first fault and the second fault, the relationship corresponding to which of the first fault and the second fault is more readily detected by automatic test pattern generation;

means for ordering the first fault and the second fault within the target fault list in a manner corresponding to the relationship; and means for performing automatic test pattern generation based upon an order of the faults of the target fault list.

18. The system of claim 17, wherein said means for measuring comprises:

means for fault simulating at least one test pattern on a netlist of the integrated circuit.

19. The system of claim 17, further comprising:

means for counting a number of times each fault has been detected by a test pattern such that each fault has a corresponding count; and means for storing information corresponding to the count of each fault.

20. A computer-readable medium having a computer program for testing an integrated circuit, said computer-readable medium comprising:

logic configured to provide a target fault list corresponding to an integrated circuit, the target fault list including at least a first fault and a second fault;

logic configured to measure a relationship between the first fault and the second fault, the relationship corresponding to which of the first fault and the second fault is more readily detected by automatic test pattern generation;

logic configured to order the first fault and the second fault within the target fault list in a manner corresponding to the relationship; and logic configured to perform automatic test pattern generation based upon an order of the faults of the target fault list.

* * * * *